(12) United States Patent
Fakih et al.

(10) Patent No.: US 10,634,504 B2
(45) Date of Patent: Apr. 28, 2020

(54) SYSTEMS AND METHODS FOR ELECTRONIC MAPPING AND LOCALIZATION WITHIN A FACILITY

(71) Applicant: Clearpath Robotics Inc., Kitchener (CA)

(72) Inventors: Adel Fakih, Kitchener (CA); Ryan Christopher Gariepy, Kitchener (CA)

(73) Assignee: CLEARPATH ROBOTICS INC., Kitchener (CA)

( * ) Notice: Subject to any disclaimer, the term of this patent is extended or adjusted under 35 U.S.C. 154(b) by 31 days.

(21) Appl. No.: 16/000,331

(22) Filed: Jun. 5, 2018

(65) Prior Publication Data
US 2019/0249992 A1    Aug. 15, 2019

Related U.S. Application Data

(60) Provisional application No. 62/515,744, filed on Jun. 6, 2017.

(51) Int. Cl.
| | |
|---|---|
| *G01C 21/20* | (2006.01) |
| *G01C 21/36* | (2006.01) |
| *G06F 17/50* | (2006.01) |
| *G05D 1/02* | (2020.01) |
| *G01C 21/32* | (2006.01) |

(52) U.S. Cl.
CPC ......... *G01C 21/206* (2013.01); *G01C 21/32* (2013.01); *G01C 21/367* (2013.01); *G05D 1/0246* (2013.01); *G05D 1/0274* (2013.01); *G06F 17/5004* (2013.01); *G06F 17/509* (2013.01)

(58) Field of Classification Search
CPC .... G01C 21/206; G01C 21/367; G01C 21/32; G06F 17/5004; G06F 17/509; G05D 1/0246; G05D 1/0274
See application file for complete search history.

(56) References Cited

U.S. PATENT DOCUMENTS

2015/0161821 A1* 6/2015 Mazula ............... G06T 19/006
345/419

* cited by examiner

*Primary Examiner* — Yuen Wong
(74) *Attorney, Agent, or Firm* — Bereskin & Parr LLP/S.E.N.C.R.L., s.r.l.

(57) ABSTRACT

Systems and methods for electronically mapping a facility are presented. The method comprises obtaining a CAD file that includes graphical representations of a facility. An occupancy-map image is generated based on the CAD file. A sensor, such as a sensor on a self-driving vehicle, is used to detect a sensed feature within the facility. Based on the sensed feature, the occupancy-map image can be updated, since the sensed feature was not one of the known features in the CAD file prior to the sensed feature being detected by the sensor.

16 Claims, 7 Drawing Sheets

SYSTEMS AND METHODS FOR ELECTRONIC MAPPING AND LOCALIZATION WITHIN A FACILITY

REFERENCE TO RELATED APPLICATIONS

This application claims priority from U.S. Provisional Patent Application No. 62/515,744, filed 6 Jun. 2017, the contents of which are incorporated herein by reference.

TECHNICAL FIELD

The described embodiments relate to systems and methods for mapping a facility, and in particular to electronically mapping and remapping a facility for the autonomous navigation of a self-driving vehicle.

BACKGROUND OF THE INVENTION

Simultaneous localization and mapping ("SLAM") is a technique that addresses the computational problem of simultaneously mapping an environment while localizing with respect to the map. For example, SLAM can be used in robotics so that a robot can generate a map of a facility for the purposes of navigation while continuously orienting itself with respect to the map. Applications for SLAM are widespread. SLAM can be used in facilities such as hospitals, warehouses, manufacturing and industrial facilities, retail locations, etc.

Known SLAM techniques require that an entire facility be traversed (e.g. by a robot) in order to generate a map of the facility. For large facilities, traversing the entire facility in order to generate a map can be an onerous task. In some cases, it may be necessary to obtain a map of the entire facility, or substantial portions thereof, before a robot can be used to perform other functions in the facility.

Some solutions have been proposed for providing a map without the requirement for traversing an entire facility or environment. For example, an electronic map for use in automobile navigation may be generated based on images of the Earth captured by a satellite. In another example, an electronic map for use by vehicles in an indoor industrial facility may be generated based on a schematic of the facility. However, in these cases, a new set of satellite images or a new schematic of the facility are required in order to update the map to reflect any changes in the environment or facility.

SUMMARY OF THE INVENTION

In a first aspect, there is a method for electronically mapping a facility. The method comprises obtaining a CAD file that has graphical representation representing known features of the facility. The CAD file may be obtained from a computer system. An occupancy-map image is generated based on the CAD file. A sensor is used to detect a sensed feature in the facility, and the occupancy-map image is updated based on the sensed feature. The sensed feature is a feature that is not part of the known features in the CAD file prior to the sensed feature being detected.

According to some embodiments, the method further comprises detecting a known feature with the sensor, and locating the sensor relative to the occupancy-map image based on detecting the known feature.

According to some embodiments, generating the occupancy-map image comprises a rasterization based on the CAD file.

According to some embodiments, the CAD file comprises graphical objects, and the rasterization is based on the graphical objects.

According to some embodiments, the CAD file further comprises non-graphical objects, and the method further comprises storing a map file on a computer system, comprising the occupancy-map image, the graphical objects, and the non-graphical objects.

According to some embodiments, the method further comprises generating a keyframe graph based on the CAD file, and storing a map file on the medium. The map file comprises the occupancy-map image and the keyframe graph.

According to some embodiments, the sensor is in communication with a control system of a self-driving vehicle, and the method further comprises storing the occupancy-map image on the control system of the self-driving vehicle and navigating the self-driving vehicle based on the occupancy-map image.

In a second aspect, there is a method for locating a sensor in a facility. The method comprises obtaining a CAD file from a non-transitory computer-readable medium that includes graphical representations representing known features of the facility. A keyframe graph is generated based on the CAD file, which includes a plurality of keyframes, each associated with a pose. A feature within the facility is detected using the sensor, and the sensed feature is then compared with the plurality of keyframes. Based on matching the sensed feature with a matched keyframe, a current pose of the sensor is determined. The matched keyframe is one of the plurality of keyframes, and the current pose is the pose associated with the matched keyframe.

According to some embodiments, the method further comprises detecting a new feature in the facility with the sensor, and updating the keyframe graph based on the new feature. The known features of the facility do not comprise the new feature prior to detecting the new feature.

According to some embodiments, generating the keyframe graph comprises determining the plurality of poses based on the range of the sensor.

In a third aspect, there is a system for electronically mapping a facility. The system comprises a sensor for detecting a sensed feature of the facility, a non-transitory computer-readable medium storing a CAD file, and a processor in communication with the sensor and the medium. The CAD file includes graphical representations representing known features of the facility. The processor is configured to generate an occupancy-map image based on the CAD file, store the occupancy-map image on the medium, and update the occupancy-map image based on the sensed feature. The sensed feature is a feature that is not part of the known features in the CAD file prior to the sensed feature being detected.

According to some embodiments, the sensor is on a self-driving vehicle, and the medium and processor are part of a control system on the self-driving vehicle. The control system of the self-driving vehicle stores the CAD file and generates the occupancy-map image.

According to some embodiments, there is a second non-transitory computer-readable medium and a second processor that are part of a server. The server is in communication with the self-driving vehicle. The CAD file is stored on the second medium, and the second processor is configured to generate the occupancy-map image. The server transmits the occupancy-map image to the self-driving vehicle.

According to some embodiments, the CAD file is stored on a non-transitory computer-readable medium that is not the second medium (i.e. is not stored on the server), and the occupancy-map image is not generated by the second processor (i.e. is not generated by the server).

According to some embodiments, the sensor is a LiDAR device.

According to some embodiments, the sensor comprises a vision system.

In a third aspect, there is a method for displaying an electronic map. The method comprises receiving a map file from a non-transitory computer-readable medium. The map file comprises graphical objects, an occupancy-map image associated with the graphical objects, and non-graphical objects associated with the graphical objects. The method further comprises displaying a rendering of the map file on a computer display, wherein the rendering comprises a graphical rendering of the occupancy-map image and textual rendering of the non-graphical objects.

According to some embodiments, the graphical rendering of the occupancy-map image comprises spatial features, and the textual rendering of the non-graphical objects comprises spatially locating text in relation to the spatial features based on the association between the spatial features, the graphical objects, and the non-graphical objects.

BRIEF DESCRIPTION OF THE DRAWINGS

A preferred embodiment of the present invention will now be described in detail with reference to the drawings, in which.

DESCRIPTION

Figure 1:
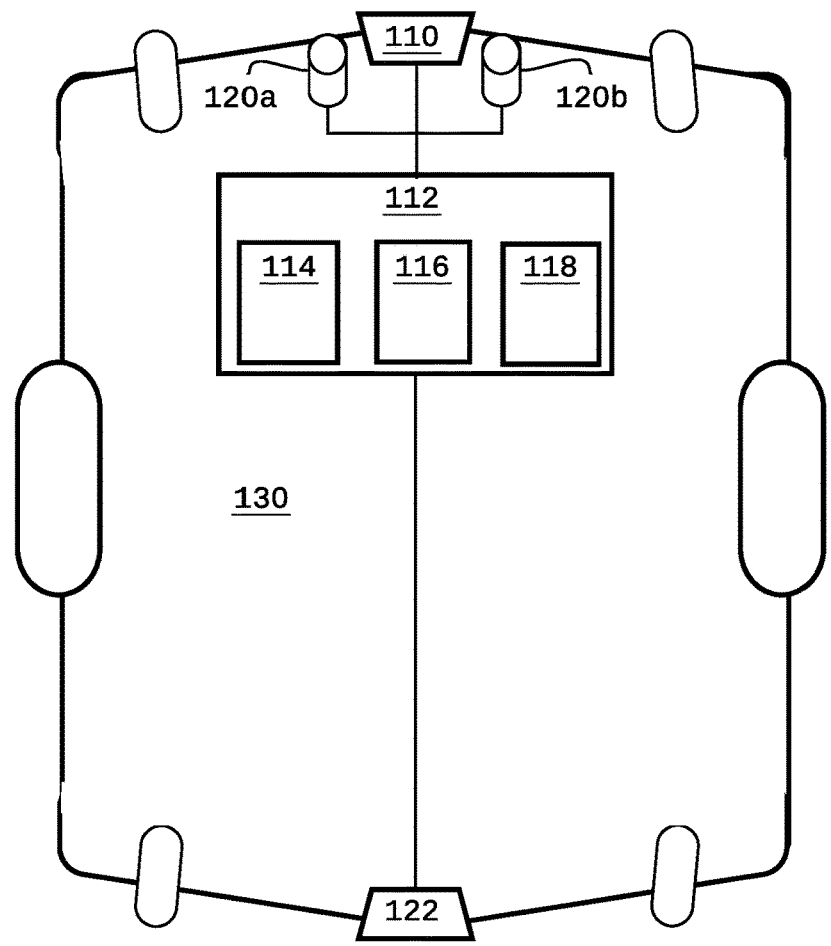
FIG. 1 is a system diagram of a system for electronically mapping a facility according to some embodiments.
Figure 1:
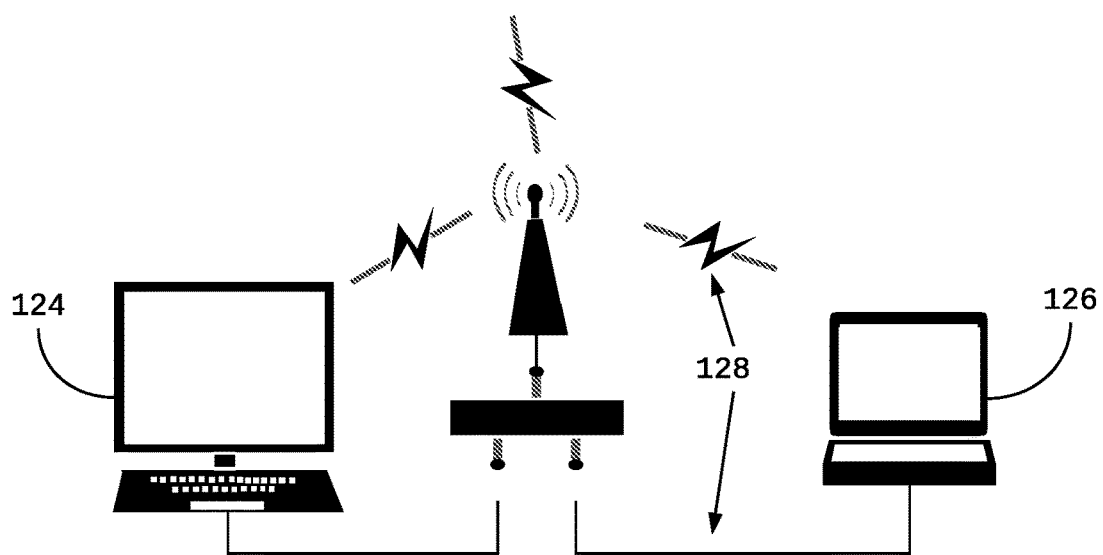

Referring to FIG. 1, there is a system 100 for electronically mapping a facility, according to some embodiments. The system comprises a sensor 110 in communication with a local computer system 112, and remote computer systems including a server 124 and a workstation 126. The computers 112, 124, and 126 are in communication using various networking equipment and communications links 128, which may include known protocols such as Ethernet and WiFi (e.g. IEEE 802.11), and cellular-based schemed such as 3G, LTE, which can be used over local-area networks (LANs), wide-area networks (WANs), the Internet, intranets, and mobile-device networks. As such, the computer 112 may be considered "local" with respect to the sensor 110, while the server 124 and the workstation 126 may be remotely located with respect to the sensor 110.

According to some embodiments, the sensor 110 can be part of (or mounted on) a self-driving vehicle 130, and the local computer system 112 can be part of the vehicle's control system. According to some embodiments, the server 124 may comprise a fleet-management system for administering and providing other functions related to a self-driving vehicle or a fleet of self-driving vehicles.

The computer 112 (e.g. as may be part of a self-driving vehicle control system) comprises a processor 114, memory 116, and a non-transitory computer-readable medium 118. The non-transitory computer-readable medium 118 may be used to store computer-readable instruction code that can be executed by the processor 114 using the memory 116 in order to configure the processor 114 to perform the steps of the various methods and processes described herein. The server 124 and the workstation 126 similarly each comprise their own processors, memory, and non-transitory computer-readable media (not shown). According to some embodiments, any or all of the methods and processes described herein (or parts thereof) may be performed by any of the computer 112, the server 124, and the workstation 126.

According to some embodiments, the sensor 110 may be a LiDAR device (or other optical/laser, sonar, or radar range-finding sensor).

According to some embodiments, a self-driving vehicle 130 may include more than one sensor and more than one type of sensor. In the example shown, the self-driving vehicle 130 includes a front sensor 110 for detecting objects in front of the vehicle, and a rear sensor 122 for detecting the objects behind the vehicle.

Additionally, or alternatively, the vehicle 130 may also include sensors 120a and 120b, which may be optical sensors, such as video cameras. According to some embodiments, the sensors 120a and 120b may be optical sensors arranged as a pair in order to provide three-dimensional (e.g. binocular or RGB-D) imaging. Similar sensors may also be included on the rear, sides, to, or bottom of the vehicle (not shown). All of the sensors 110, 120a, 120b, and 122 may be generally or collectively referred to as "sensors".

In the example of a self-driving vehicle, the computer 112 may be part of the vehicle's control system that is in communication with the sensors 110, 120a, 120b, and 122. The control system may store an electronic map of the vehicle's environment in the medium 118. The control system may use the electronic map, along with input received from the sensors in order to autonomously navigate the vehicle. For example, the control system, along with the sensors, may implement a simultaneous localization and mapping ("SLAM") technique in order to map the vehicle's environment and to locate the vehicle (i.e. locate the sensors) relative to the stored electronic map.

Figure 2:
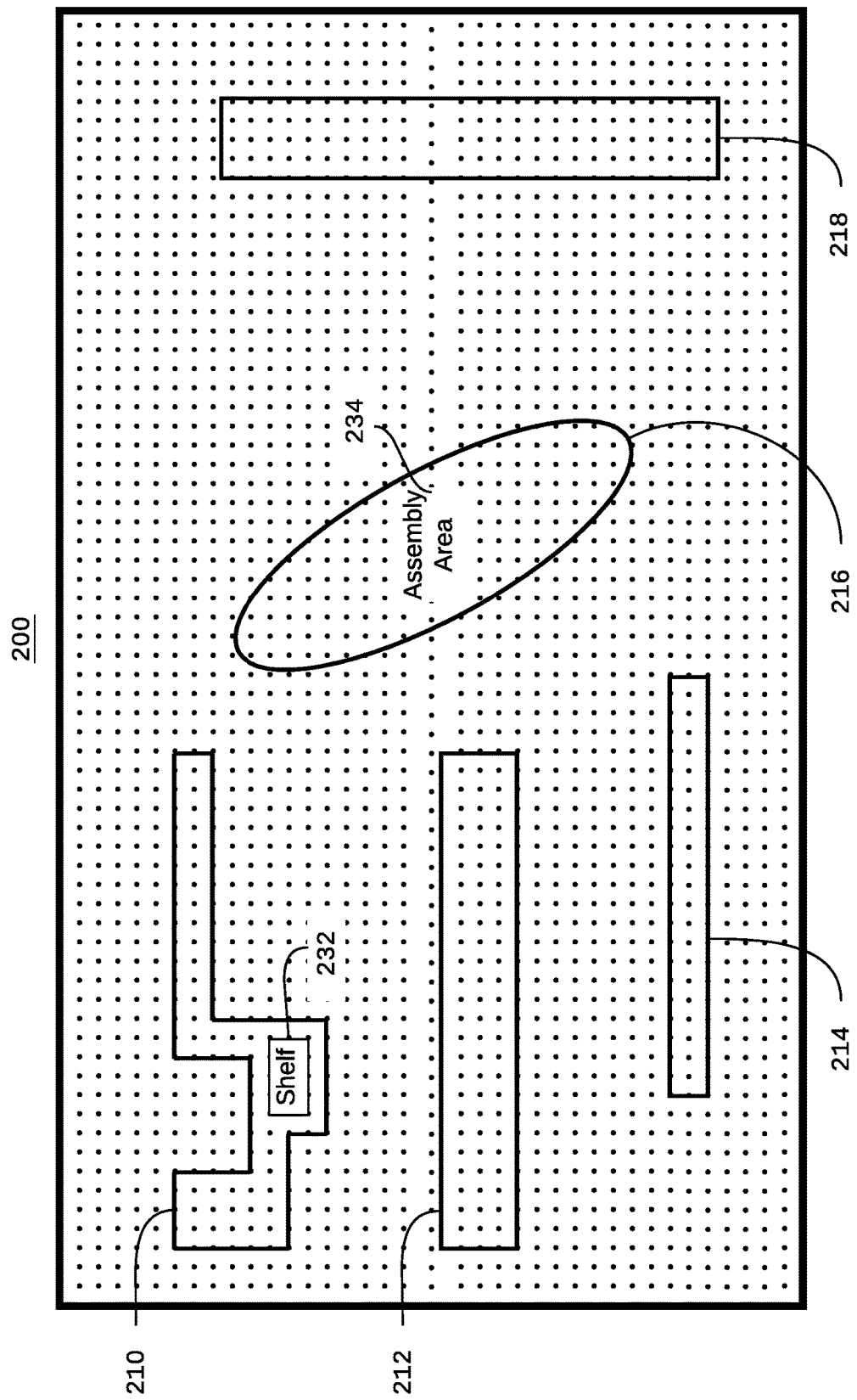
FIG. 2 is a visual representation of a CAD file of a facility, such as may be used by the system shown in FIG. 1.

Referring to FIG. 2, there is shown a visual representation of a computer-aided design ("CAD") file of a facility 200, according to some embodiments. CAD files may be generated using computer software that allows a human operator to create two-dimensional and three-dimensional drawings and models. For example, a CAD file can be used to draw the floorplan of an industrial facility. Generally, CAD files may be stored in a human-readable format such as ASCII text. CAD files may comprise graphical objects that represent spatial features that can be rendered and displayed by a computer.

Graphical objects may define where the object should be displayed (i.e. in space), the color of the object, the dimensions of the object, the shape of the object, etc. Non-graphical objects may provide additional information associated with the CAD file as a whole, or with specific graphical objects. For example, a name associated with a graphical object may be stored as a non-graphical object.

As shown in FIG. 2, the CAD file may be displayed in respect of graduations (shown as a dot grid) in order to assist a human who is creating, editing, or viewing the CAD file to understand the scale and dimensions of the objects in the CAD file.

The CAD file 200 includes graphical objects 210, 212, 214, 216, and 218, which relate to the features of the facility. In other words, the CAD file 200 represents a layout of the floor of the facility, which shows where particular features are located.

For example, the feature represented by the graphical object 210 may be a shelf, such as an inventory shelf. In association with the graphical object 210 is the textual rendering of a non-graphical object 232. As shown, the non-graphical object 232 includes the information "Shelf", and the non-graphical object has been rendered in order to display the word "Shelf" over the graphical object 210.

Similarly, a non-graphical object 234 includes the information "Assembly Area". In the example shown, the text "Assembly Area" is not necessarily rendered (shown) with respect to the visual representation of the CAD file 200. Rather, the information pertaining to the non-graphical object 234 is shown in FIG. 2 to indicate that "Assembly Area" may be information (e.g. metadata) associated with the graphical object 216.

Figure 3:
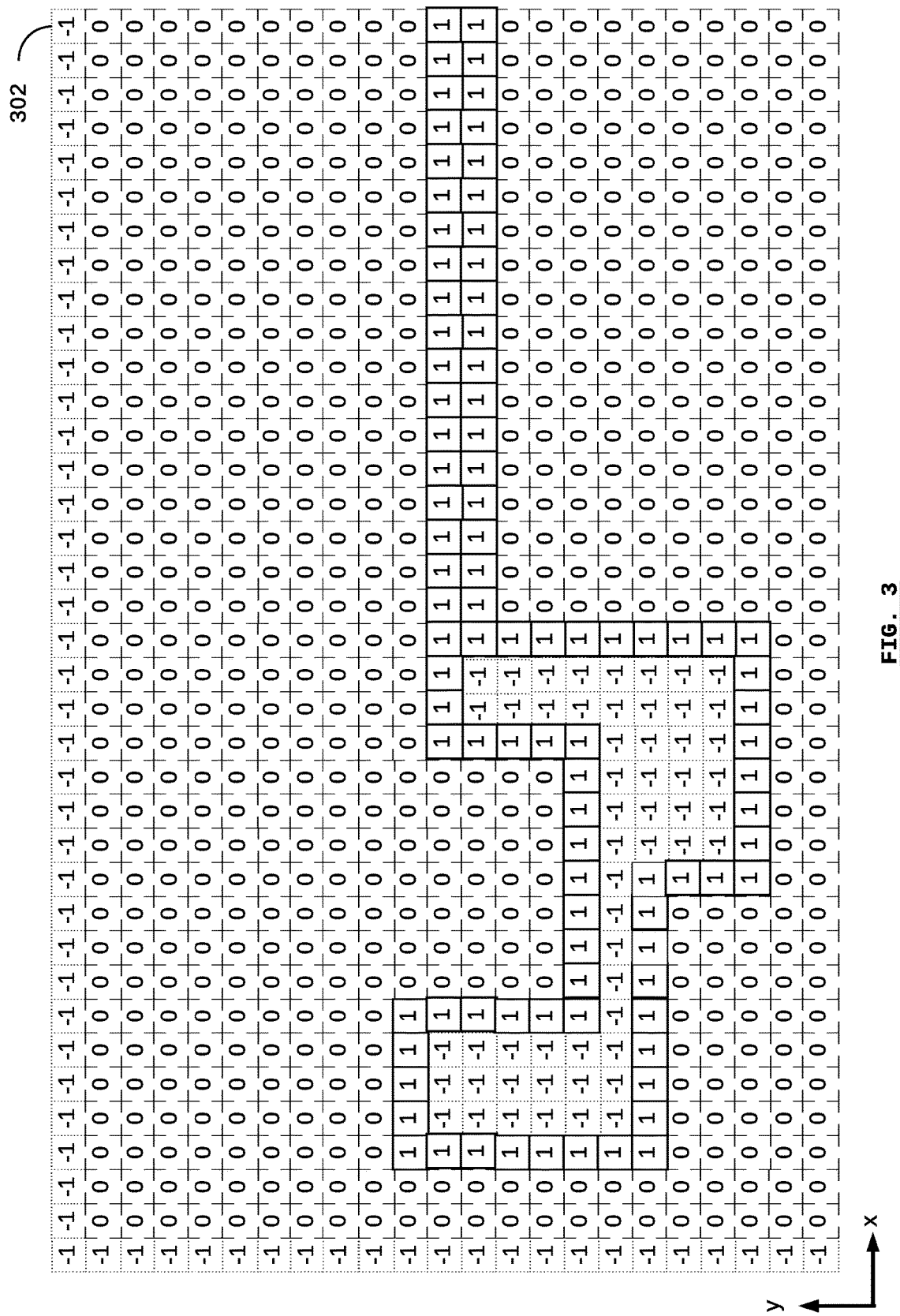
FIG. 3 is a visual representation of an occupancy-map image, such as may be originally generated based on the CAD file shown in FIG. 2.

Referring to FIG. 3, there is shown a visual representation of an occupancy-map image 300 for the sake of description and explanation. The occupancy-map image 300 corresponds to the upper-left corner of the CAD file 200 shown in FIG. 2, including correspondence to the feature 210.

The term "image" is used herein with respect to "occupancy-map image" since an occupancy-map image is a computer file that can be represented in a raster format. According to some embodiments, the occupancy-map image may be in the form of a bitmap file. According to some embodiments, the occupancy-map image may be in the form of a portable greymap ("PGM") file.

Generally, the occupancy-map image file may be defined in terms of individual pixels, points, or regions determined by a discrete location, and with a corresponding value assigned to each discrete location. As shown in FIG. 3, the occupancy-map image 300 comprises a grid that defines discrete squares (pixels), such as the pixel 302 in the top right corner.

For example, and in respect of FIG. 3, locations can be defined in terms of x-y coordinates. As such, the bottom row of pixels in the occupancy-map image 300 may have the (x,y) coordinates (0,0), (1,0), (2,0), etc., from left and counting to the right. Similarly, the left-most column may have the (x,y) coordinates (0,0), (0,1), (0,2), etc., from the bottom and counting upward.

A value is assigned for each pixel in the occupancy-map image. According to some embodiments, the values may correspond to states of "occupied", "not occupied", and "unknown". In the example shown FIG. 3, each of these states is represented by the value 1, 0, and −1 respectively. For the sake of explanation and to enhance visual perception, the pixel cells in FIG. 3 are shown with a specific border based on their value.

For example, and in regards to the coordinate system described above, the occupancy-map image 300 includes pixels with (x,y,value) of (0,6,−1), (1,6,0), (2,6,0), (3,6,1), and (4,6,−1). Referring back to FIG. 2, the pixels (0,6,−1) represents the left-most part of the facility, which has not yet been mapped, and is thus "unknown". The pixels (1,6,0) and (2,6,0) represent the "unoccupied" (and known) area to the left of the feature 210. The pixel (3,6,1) represents the boundary of the feature 210 and is thus "occupied". The pixel (4,6,−1) represents an "unknown" area that is internal to (i.e. enclosed by) the feature 210.

According to some embodiments, pixels that are internal to (i.e. enclosed by) a feature may be assigned a value of "unknown", since a sensor may not be able to determine what is beyond (e.g. behind) the boundary of the feature. According to some embodiments, when the occupancy-map image file is being generated or updated, it may be possible to determine that a feature encloses a region, and therefore set all of the internal pixel values as "occupied". According to some embodiments, pixels that are internal to (i.e. enclosed by) a feature by assigned a value of "occupied" based on the definition of the graphical objects in the CAD file even though the sensors may not be able to detect objects internal to the physical feature.

Generally, an occupancy-map image may be used with known SLAM techniques. For example, the occupancy-map image may be used with respect to the mapping and re-mapping aspects of known SLAM techniques.

Figure 4:
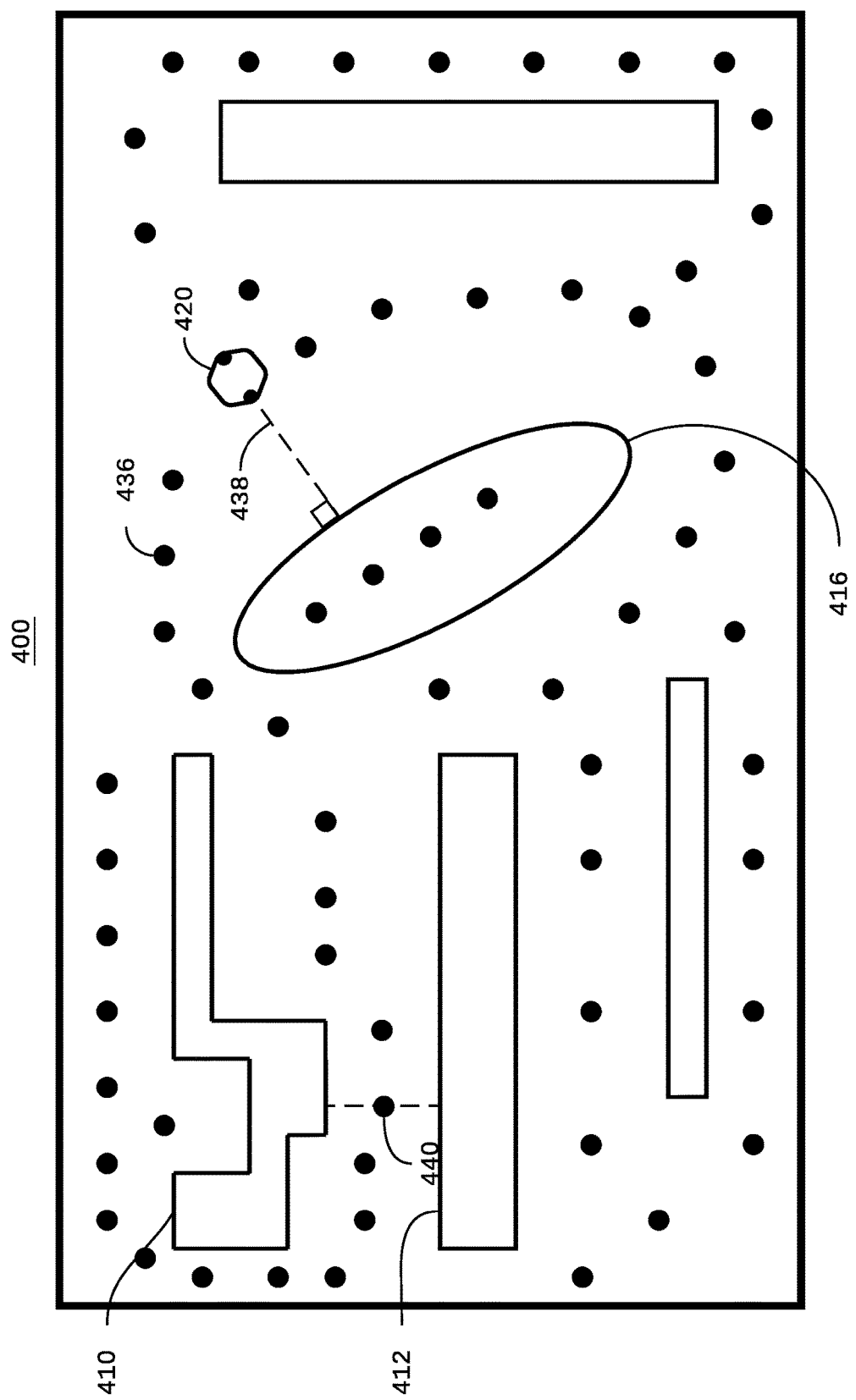
FIG. 4 is a visual representation of a key-frame graph such as may be originally generated based on the CAD file shown in FIG. 2.

Referring to FIG. 4, there is shown a visual representation of a keyframe graph 400 according to some embodiments. Similar numerals are used in FIG. 4 as in FIG. 2 in order to label similar or corresponding elements.

Similar to the occupancy-map image previously discussed, the keyframe graph may be used with known SLAM techniques. For example, the key-frame graph may be used with respect to the localization aspects of known SLAM techniques. Generally, keyframes can be used as a reference point that can serve as the basis for localization using visual SLAM techniques and/or integrated inertial-visual SLAM techniques.

The keyframe graph 400 includes multiple poses, represented by dots in FIG. 4, such as the pose 436, at which a keyframe is determined. According to known SLAM techniques, keyframes may be determined at any arbitrary pose, by gathering sensor data at the pose. The population of keyframe poses in a graph may be relatively sparse or dense according to the particular technique used. For example, keyframes may be generated by moving a sensor throughout a facility, and gathering sensor data at poses defined in terms of time (e.g. periodically), displacement, or other events.

According to some embodiments, SLAM techniques can be employed without moving the sensor from one pose to another, by generating a keyframe graph from a CAD file. According to some embodiments, the keyframe graph may be generated based on the graphical objects in a CAD file. In other words, a keyframe graph can be generated from a CAD file so that SLAM localization techniques can be employed, without having to first gathering sensor data from a series of poses.

FIG. 4 uses an example of a sensor on a self-driving vehicle 420 for the sake of description. In the example, the sensor on the self-driving vehicle 420 has a maximum range as indicated by the dashed line 438. According to some embodiments, simulated keyframe poses may be determined based on a location transform of the graphical objects in the CAD file based on the range of the sensor. In other words, if the range of the sensor is known or can be assumed, then the simulated poses used for generating the keyframes can be located at a distance from a particular feature (e.g. the feature 416) based on the sensor range, in order to produce a relatively sparse keyframe graph.

According to some embodiments, it is not necessary to generate a keyframe for a pose that is located at a distance greater than the range of the sensor from any feature defined by a graphical object in the CAD file.

According to some embodiments, when there are two features separated by a distance that is less than the range of the sensor, then a keyframe may be generated at a pose that is half-way between each feature. For example, the pose 440 is located equidistant from the features 410 and 412.

Once a simulated pose has been determined for a keyframe, then the associated keyframe data (i.e. simulating the data that would otherwise be gather by the sensor at the simulated pose) can be determined based on the graphical objects in the CAD file, thereby generating an initial keyframe graph that can be used for localization with SLAM.

Subsequently, the keyframe graph can be updated as a sensor is moved through the facility, according to known SLAM techniques.

Figure 5:
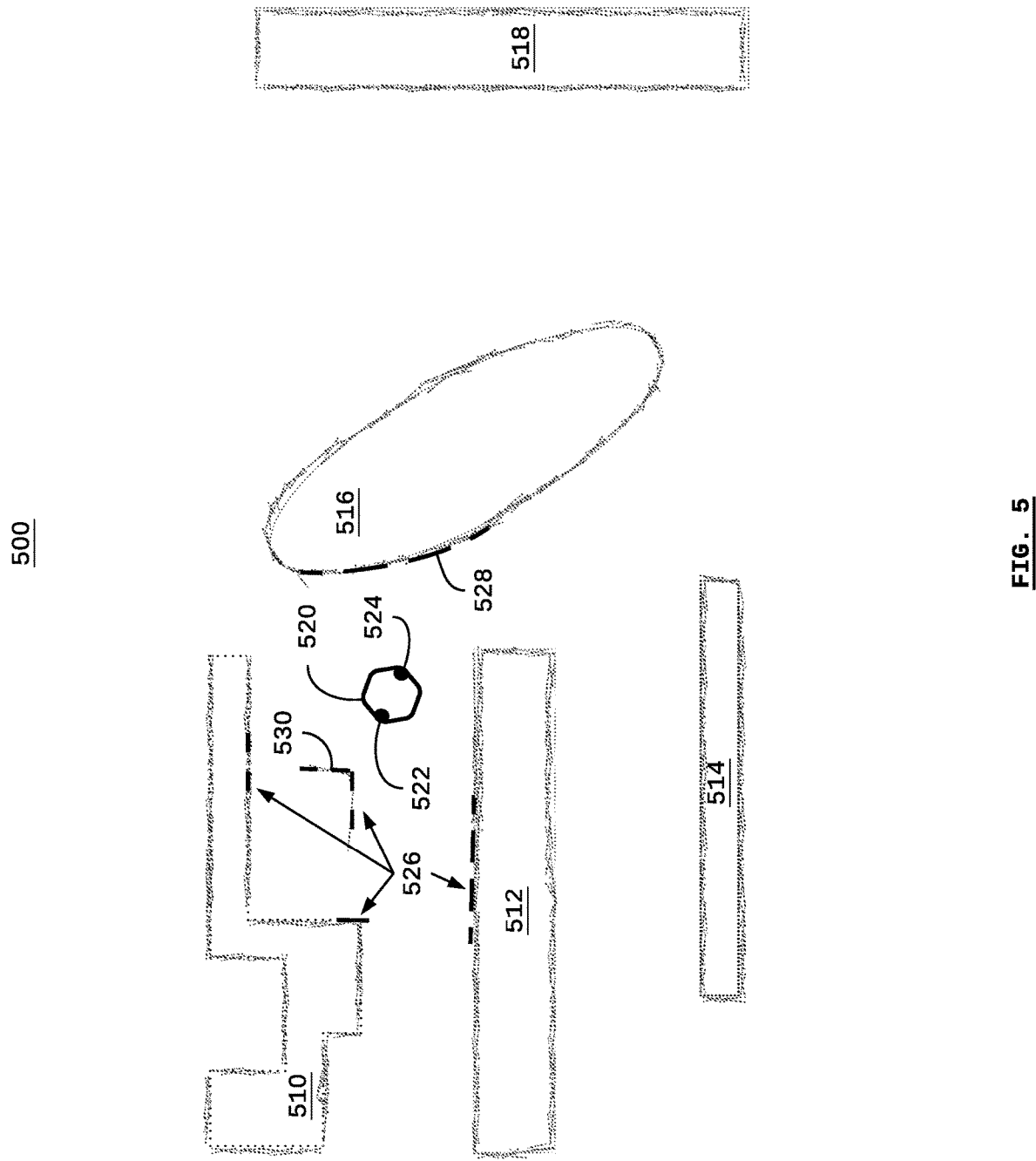
FIG. 5 is a visual representation of the facility in FIG. 1 as determined by the sensors of a self-driving vehicle.

Referring to FIG. 5, there is shown a visual representation of a facility 500 as determined by a self-driving vehicle 520. Similar numerals are used in FIG. 5 as in FIG. 2 in order to label similar or corresponding elements.

The self-driving vehicle 520 includes a front sensor 522 and a rear sensor 524. According to some embodiments, the self-driving vehicle 520 may have any number of sensors, such as a front sensor only, multiple front sensors, a rear sensor only, sensors for scanning in three dimensions, side sensors, etc.

The features 510, 512, 514, 516, and 518 represent objects that have been detected by at least one of the sensors 522 and 524 as the vehicle 520 moves through the facility 500. As the vehicle 520 moves through the facility 500, it is periodically, arbitrarily, or continuously deemed to be in a "pose". A pose is defined as a particular location and orientation in the facility 500 (e.g. a location defined in terms of an (x,y) coordinate and an angle of rotation or direction, e.g. yaw).

At each pose, the sensors 522 and 524 perform a scan in order to detect objects within a field-of-view. The scan can be understood in terms of a set of lines projecting from the sensors at any particular time across the sensor's viewing angle. The scan lines can be understood as corresponding to discrete pixels (e.g. the pixels in the occupancy-map image as previously described with respect to FIG. 3). For a particular scan line, a sensor (e.g. the sensor 522) measures the distance to a detected object. The distance can be determined in terms of pixels. When an object is detected, the pixel corresponding to the object's distance is deemed to be "occupied". The pixels between the sensor 522 and the object are deemed to be "unoccupied". The pixels on the other side of the object from the sensor 522 are deemed to be "unknown" with respect to the particular scan.

At each pose, multiple scans may be performed across a viewing angle, and the scans from multiple poses are accumulated in order to produce an image representing the plane of the facility 500. (Each scan on its own may only represent a line). Since there may be some variance and/or tolerance and/or noise or other errors involved for a particular scan, when multiple scans from multiple poses are accumulated, the boundaries or edges for a particular object may vary from one pose to another. As such, the boundaries of the features 510, 512, 514, 516, and 518 are shown to be somewhat "blurry", and not necessarily defined by a single, straight line (e.g. as compared to the CAD file in FIG. 2).

The dashed lines 526 indicates the objects detected by the front sensor 522, and the dashed line 528 indicates the objects detected by the rear sensor 524 for the scans that are performed at the particular pose shown for the vehicle 520 in FIG. 5.

In the example shown in FIG. 5, it is assumed that the vehicle 520 has already traversed the entire facility 500 at least once, and, thus, the facility 500 is general known to the vehicle 520. Conversely, if the pose shown in FIG. 5 was the first pose (i.e. location of first scans) for the vehicle 520, then the only information known to the vehicle 520 would be the dashed lines 526 and 528 and the area between the vehicle 520 and the dashed lines 526 and 528.

In other words, the visual representation of the facility 500 as determined by the self-driving vehicle 520 provides the information used in generating or updating an occupancy-map image, such as the occupancy-map image 300 shown in FIG. 3. According to some embodiments, an occupancy-map image may be generated based on a CAD file, and then subsequently updated based on scans by the sensors 522 and 524, thereby enabling the ability for the sensors to "remap" the facility on an ongoing basis as the vehicle moves through the facility.

As shown in FIG. 5, the front sensor 522 of the vehicle 520 has detected an object 530. As compared to the CAD file shown in FIG. 2, it is important to note that the object 530 does not correspond to a feature in the CAD file. In other words, the object 530 may represent a physical object that was omitted from the CAD file, or that has been placed in the facility 500 or moved at a point in time after the creation of the CAD file.

Figure 6:
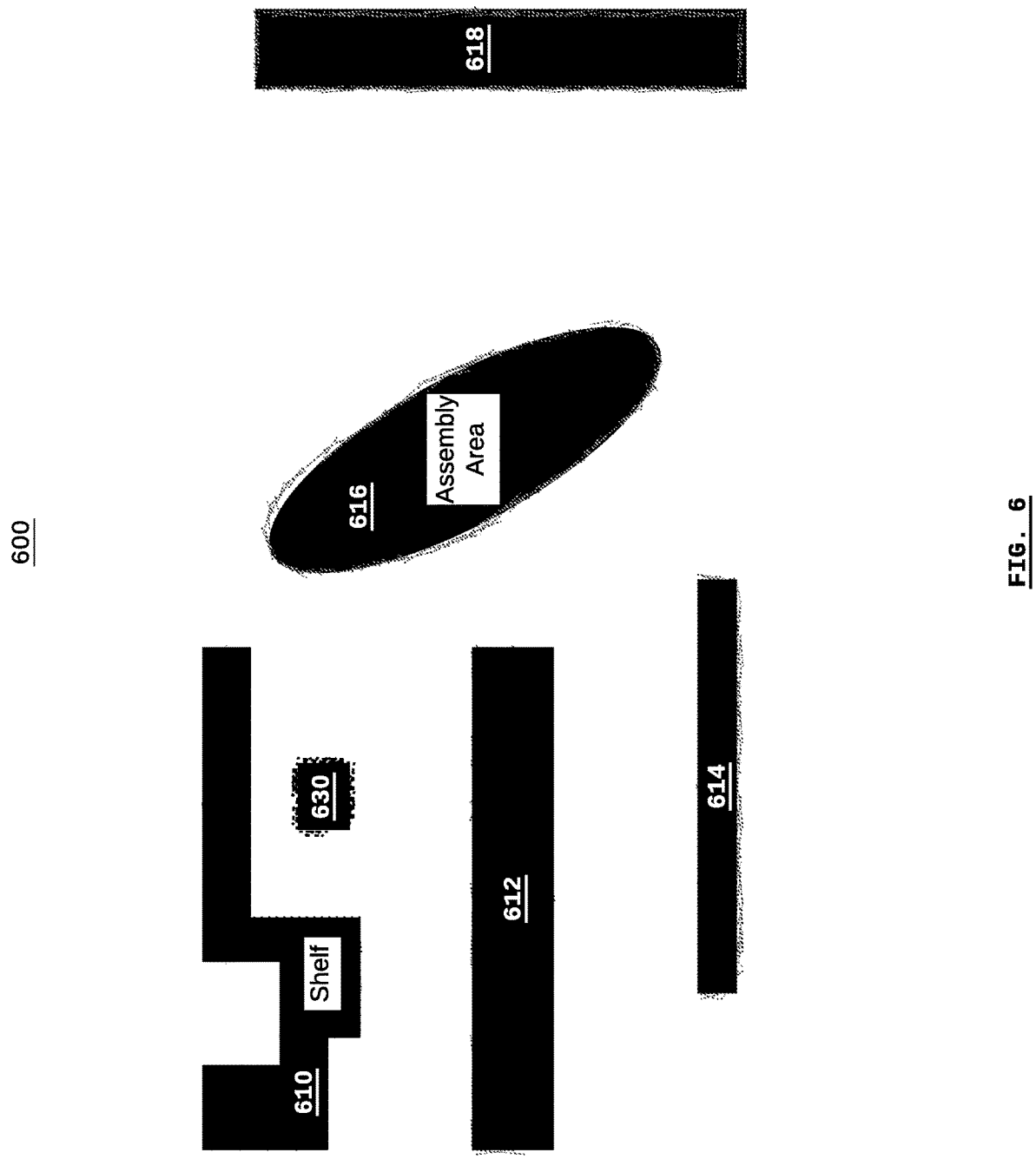
FIG. 6 is a visual representation of a map file comprising the CAD file of FIG. 1 and an associated occupancy-map image.

Referring to FIG. 6, there is shown a rendering of an electronic map 600, for example, as may be displayed on a computer display. The electronic map 600 comprises both the CAD file from FIG. 2 and the occupancy-map image formed in relation to the visual representation in FIG. 5. Similar numerals are used in FIG. 6 as in FIG. 2 and FIG. 5 in order to label similar or corresponding elements.

According to some embodiments, the map file (on which the rendering shown in FIG. 6 is based) may comprise a CAD file (or any components thereof) and an occupancy-map image file (or any components thereof). According to some embodiments, the CAD file may comprise graphical objects and non-graphical objects.

As shown in FIG. 6, the features 610, 612, 614, 616, and 618 may be rendered based on the CAD file and/or the occupancy-map image. For example, the graphical objects of the CAD file may be the basis for the graphical rendering of the features 610, 612, 614, 616, and 618. In the event that a vehicle (or sensor) has not traversed the facility in order to map the facility, then the CAD file may serve as the only basis for the graphical rendering of the features 610, 612, 614, 616, and 618.

According to some embodiments, the graphical rendering of the features may be based on the occupancy-map image. The occupancy-map image may be generated based on the CAD file, and, subsequently, updated based on vehicle sensor scans.

Following on the examples described in respect of FIG. 2 and FIG. 5, if it is assumed that the feature 630 was not represented in the CAD file, then the graphical rendering of the feature 630 is based on vehicle sensor scans.

The features shown in FIG. 6 are indicative of graphical renderings based on the graphical objects in a CAD file as well as vehicle sensor scans. Generally, graphical renderings based on graphical objects in a CAD file are more likely to present straight lines and "crisp" edges, whereas graphical renderings based on vehicle sensor scans may present "blurry" lines and less-definite edges.

According to some embodiments, textual (or other) renderings based on non-graphical objects from the CAD file may also be displayed. For example, a non-graphical object in the CAD file may represent the word "Shelf", and the non-graphical object may be associate with the graphical object associated with the feature 610. By associating the location of the non-graphical object with the location of the graphical object in the CAD file, and by rendering the graphical object, it is possible to render the word "Shelf" with the feature 610.

According to some embodiments, non-graphical objects in the CAD file may be used as meta data (i.e. data that describes other data) in the map. For example, the name "Assembly Area" may be associated with the feature 616, even though the text "Assembly Area" may not necessarily be displayed on the rendering of the electronica map 600. In this way, the name "Assembly Area" can be used as a human-readable navigational instruction, such as by instructing a vehicle to "delivery payload at assembly area".

Figure 7:
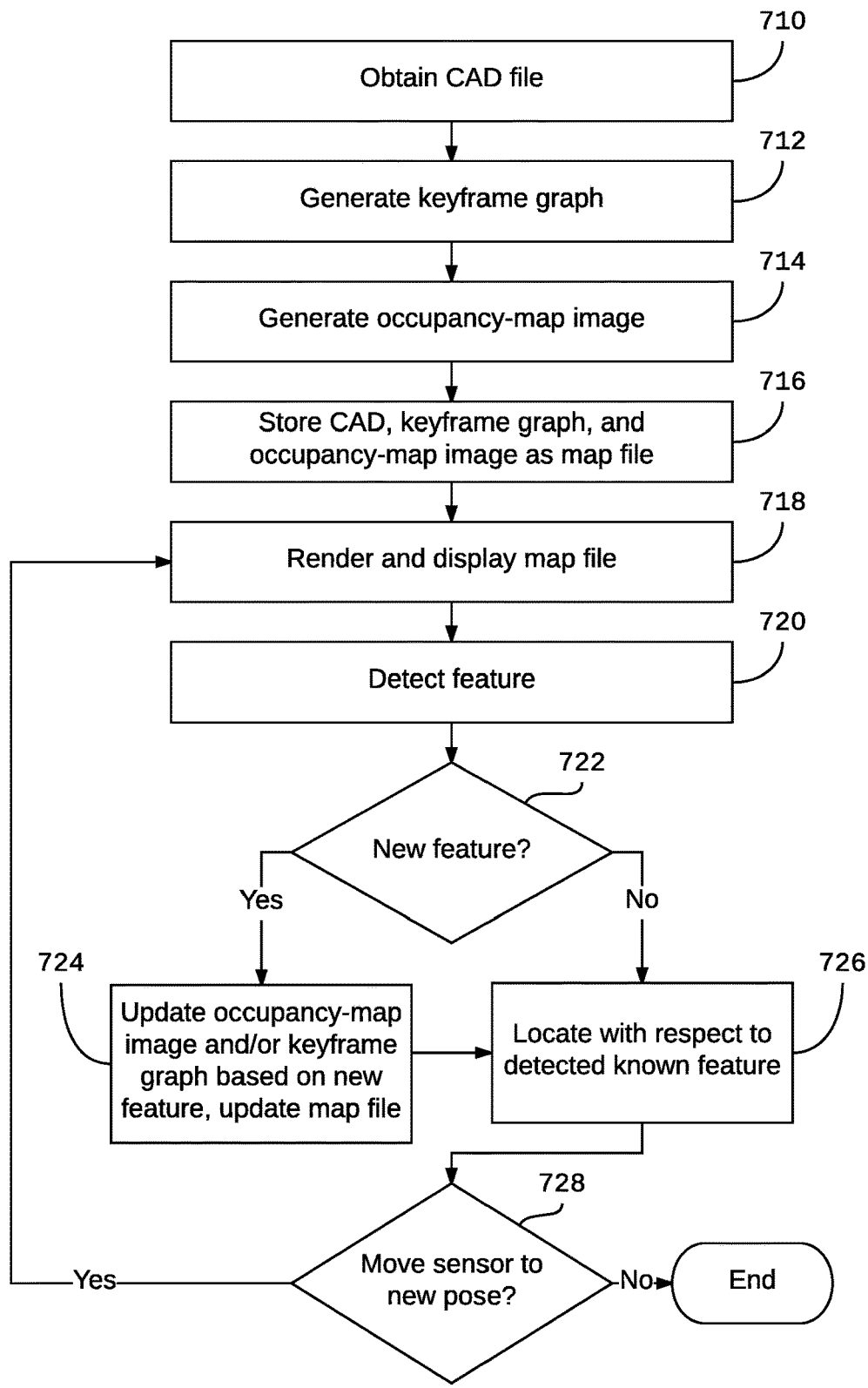
FIG. 7 is a flow diagram depicting a method for electronically mapping a facility, according to some embodiments.

Referring to FIG. 7, there is shown a method 700 for electronically mapping a facility according to some embodiments. According to some embodiments, the method, and individual steps of the method, may be represented by computer-executable instructions stored on a non-transitory computer-readable medium that, when executed, cause a computer processor to be configured to execute the method 700 or individual steps thereof.

The method begins at step 710, when a CAD file is obtained. According to some embodiments, a CAD file may be uploaded to a computer system, for example, via a computer network, or using removable storage such as a removable hard drive or USB thumb drive. According to some embodiments, a CAD file may be uploaded to a server or workstation that is remotely connected to sensors. For example, in the case of a self-driving vehicle, the CAD file may be uploaded to a fleet-management system, or a workstation used for generating a map file. According to some embodiments, the CAD file may be uploaded to a computer that is local to (i.e. directly connected to) the sensors. For example, in the case of a self-driving vehicle, the CAD file may be uploaded to the vehicle's control system.

At step 712, a keyframe graph is generated based on the CAD file. According to some embodiments, the CAD file may comprise graphical objects and non-graphical objects; and the generation of the keyframe graph may be based on the graphical objects. According to some embodiments, generating the keyframe graph may include determining keyframe poses based on the detection range of the sensor.

At step 714, an occupancy-map image is generated based on the CAD file. According to some embodiments, the CAD file may comprise graphical objects and non-graphical objects; and the generation of the occupancy-map image may be based on the graphical objects. According to some embodiments, generating the occupancy-map image may include a rasterization of the CAD file.

As used here, "rasterization" refers to the general process of converting procedural descriptions into a raster graphic format. In the field of computer graphics, the term "rasterization" may specifically refer to the conversion of a vector graphic to a raster graphic, such as in rasterizing a three-dimensional vector model to a two-dimensional plane in order to display the resulting two-dimensional raster graphic on a computer display screen. However, as used here, the term "rasterization" is given a more general meaning. For example, "rasterization" can refer to the process of converting graphical representations in a binary or human-readable format (such as ASCII text) into a raster image (such as a bitmap). According to some embodiments, the occupancy-map image may be in the form of a bitmap file.

According to some embodiments, the occupancy-map image may be in the form of a portable greymap ("PGM") file. According to some embodiments, the bitmap values (i.e. values associated with each pixel) may be a value corresponding to any one of a state of "occupied", "unoccupied", and "unknown".

Depending on the particular implementation of the system executing the method 700, the occupancy-map image may be generated by any one of a remote server (e.g. fleet-management system), a remote workstation, and a computer local to a sensor such as that of a control system on a self-driving vehicle. For example, in some cases, the occupancy-map image may be subsequently used by a computer local to a sensor such as that of a control system on a self-driving vehicle, but the occupancy-map image may nonetheless be (originally) generated by a remote computer based on a CAD file. In other cases, a computer local to a sensor such as that of a control system on a self-driving vehicle may generate the occupancy-map image based on a CAD file.

At step 716, a map file is stored on a non-transitory computer-readable medium. According to some embodiments, the map file is based on the CAD file, the keyframe graph, and the occupancy-map image, as previously described. The map file may be stored on any or all of a remote computer such as a server (e.g. fleet-management system) or workstation, and a computer local to a sensor such as that of a control system of a self-driving vehicle.

At step 718, the map file may be rendered and displayed. According to some embodiments, the map file may be rendered and displayed by any or all of a remote computer (e.g. a workstation) and a computer that is local to a sensor. For example, in the case of a self-driving vehicle (i.e. the sensors are on the vehicle), a local display may be mounted on or near the vehicle in order to provide a user interface to a human operator for reporting on the mapping and location of vehicle and/or providing tasks and instructions to the vehicle. Similarly, a remote workstation may display the map file in order to provide a user interface to a human operator in a location that is different from the vehicle's location in order to report on the mapping and location of the vehicle and/or provide tasks and instruction to the vehicle.

As previously described, rendering and displaying the map file may comprise any or all of rendering and displaying the individual CAD file, which may include graphical and non-graphical objects, and the occupancy-map image. According to some embodiments, rendering and displaying the map file may comprise rendering and displaying the occupancy-map image, wherein the occupancy-map image is based on information from the CAD file and/or information obtained from sensor scans. According to some embodiments, rendering and displaying the map file may comprise rendering and displaying graphical objects directly from the CAD file and rendering and displaying the occupancy-map image (e.g. with one rendering overlaying the other). According to some embodiments, rendering and displaying the map file may comprise a textual rendering of non-graphical objects from the CAD file, which may include overlaying the textual renderings with the graphical renderings based the graphical objects from the CAD file and/or the occupancy-map image.

Generally, the graphical objects of the CAD file and the occupancy-map image represent spatial features (e.g. defining a particular feature in terms of its spatial relationships and positioning), whereas the non-graphical objects of the CAD file represent features that are not necessarily defined in terms of space. As such, according to some embodiments, associations between graphical objects and non-graphical objects, as defined in the CAD file, can be used to spatially locate the non-graphical objects, if desired. For example, if the non-graphical objects represent text, and it is desired to render the text when rendering the map file, then the text can be spatially located in relation to the spatial features based on the associations defined in the CAD file.

At step 720, a feature is detected by a sensor. For example, the feature may be detected by a sensor of a self-driving vehicle. Generally, the detection of a feature may be associated with a particular pose of the sensor.

At step 722, a determination is made as to whether the detected feature is a new feature, or a known feature. In other words, was the detected feature included in the CAD file obtained during step 710 and/or has the feature been detected during a previous iteration of the method 700? According to some embodiments, the determination can be made by comparing the sensor scan with which the feature was detected with the current occupancy-map image. If the sensor scan indicates that a particular pixel is "occupied" but the occupancy-map image indicates "unoccupied" or "unknown", then the detected feature may be a new feature.

If, at step 722, it is determined that the feature is a changed feature (and thus not a known feature), then the method proceeds to step 724. At step 724, the occupancy-map image is updated based on the difference in features. As used here, the term "changed feature" can refer to any or all of an addition, alteration, or removal of a feature. For example, a new feature may be added, and this may be a "changed feature". A known feature may be removed, and this may be a "changed feature". A known feature may be moved or reoriented, and this may be a "changed feature".

According to some embodiments, the keyframe graph is a part of (i.e. stored in) the map file, and, therefore, updating the keyframe graph is synonymous with updating the map file. According to some embodiments, the keyframe graph may be subsequently updated accordingly. According to some embodiments, the map file may be updated and the keyframe graph may be updated. As such, the "changed" feature may become a feature in a keyframe that maybe be subsequently used to locate the sensor relative to the map according to known SLAM techniques.

According to some embodiments the occupancy-map image is a part of (i.e. stored in) the map file, and, therefore, updating the occupancy-map image is synonymous with updating the map file. According to some embodiments, the occupancy-map image may be updated, and the map file may be subsequently updated accordingly. According to yet further embodiments, the map file may be updated and then the occupancy-map image updated. As such, the "changed" feature becomes a "known" feature. The method then proceeds to step 726. According to some embodiments, determining that a feature is a changed feature may be via known SLAM techniques.

If, at step 722, it is determined that the feature is a known feature (and thus not a new feature), then the method proceeds to step 726.

At step 726, the sensor may be located with respect to the detected (known) feature. According to some embodiments, a localization technique may be employed according to known SLAM techniques. According to some embodiments, the localization technique may use one or more keyframes as a reference, using SLAM techniques such as visual SLAM or integrated inertial-visual SLAM.

According to some embodiments, locating the sensor (e.g. locating a vehicle that includes a sensor) within a facility may comprise comparing a feature detected by the sensor with the keyframe data associated with the keyframe graph. Since each keyframe is associated with a pose, when a match is found between the keyframe data and the feature detected by the sensor, the location of the sensor can be determined based on the pose associated with the matched keyframe.

At step 728, the sensor may be moved to a new pose in order to perform a new scan. For example, if the sensor is a sensor on a self-driving vehicle, the vehicle may move through a facility in the performance of a particular task or mission (e.g. a task or mission unrelated to mapping). While the vehicle is moving, sensor scans may be simultaneously performed, which may contribute to ongoing mapping (or remapping) of the facility. In this way, a CAD file describing the entire facility may be used to generate an initial occupancy-map image, and occupancy-map image can be updated based on sensor scans in order to account for any changes in the facility. As such, the CAD file may be used as an original "map" of the facility without the need for the vehicle to traverse (i.e. "map") the entire facility. However, despite the CAD file being static, the "map" may be updated as the vehicle subsequently traverses the facility.

The present invention has been described here by way of example only. Various modification and variations may be made to these exemplary embodiments without departing from the spirit and scope of the invention, which is limited only by the appended claims.

We claim:

1. A method for electronically mapping a facility, the method comprising:
   obtaining, by a processor, a CAD file from at least one non-transitory computer-readable medium, the CAD file having graphical representations representing known features of the facility;
   generating, by the processor, an occupancy-map image based on the CAD file;
   generating, by the processor, a keyframe graph based on the CAD file;
   storing a map file on the at least one non-transitory computer-readable medium, wherein the map file comprises the occupancy-map image and the keyframe graph;
   detecting, by the processor, a sensed feature in the facility with at least one sensor; and
   updating, by the processor, the occupancy-map image based on the sensed feature; and
   wherein the sensed feature is not a feature of the known features of the facility prior to the processor detecting the sensed feature.

2. The method of claim 1, further comprising:
   detecting at least one of the known features of the facility with the at least one sensor; and
   locating the at least one sensor relative to the occupancy-map image based on the detecting the at least one of the known features.

3. The method of claim 1, wherein generating the occupancy-map image comprises a rasterization based on the CAD file.

4. The method of claim 3, wherein the CAD file comprises graphical objects, and the rasterization is based on the graphical objects.

5. The method of claim 4, wherein the CAD file further comprises non-graphical objects; and the map file further comprises the graphical objects, and the non-graphical objects.

6. The method of claim 1, wherein:
   the at least one sensor is in communication with a control system of a self-driving vehicle;
   the method further comprising:
   storing the occupancy-map image on the control system of the self-driving vehicle; and navigating the self-driving vehicle based on the occupancy-map image.

7. The method of claim 1, wherein the at least one sensor comprises a LiDAR device.

8. The method of claim 1, wherein the at least one sensor comprises a vision system.

9. A system for electronically mapping a facility, the system comprising:
   at least one non-transitory computer-readable medium;
   at least one sensor; and
   a processor operable to:
      obtain a CAD file from the at least one non-transitory computer-readable medium, the CAD file having graphical representations representing known features of the facility;
      generate an occupancy-map image based on the CAD file;
      generate a keyframe graph based on the CAD file;
      store a map file on the at least one non-transitory computer-readable medium, wherein the map file comprises the occupancy-map image and the keyframe graph;
      detect a sensed feature in the facility with the at least one sensor; and
      update the occupancy-map image based on the sensed feature;
      wherein the sensed feature is not a feature of the known features of the facility prior to the processor detecting the sensed feature.

10. The system of claim 9 wherein the processor is operable to:
   detect at least one of the known features of the facility with the at least one sensor; and
   locate the at least one sensor relative to the occupancy-map image based on the detecting the at least one of the known features.

11. The system of claim 9 wherein the processor is operable to generate a rasterization based on the CAD file as the occupancy-map image.

12. The system of claim 11, wherein the CAD file comprises graphical objects, and the rasterization is based on the graphical objects.

13. The system of claim 12, wherein the CAD file further comprises non-graphical objects; and the map file further comprises the graphical objects, and the non-graphical objects.

14. The system of claim 9, wherein:
   the at least one sensor is in communication with a control system of a self-driving vehicle; and
   the processor is operable to:
      store the occupancy-map image on the control system of the self-driving vehicle; and
      navigate the self-driving vehicle based on the occupancy-map image.

15. The system of claim 9, wherein the at least one sensor comprises a LiDAR device.

16. The system of claim 9, wherein the at least one sensor comprises a vision system.

* * * * *